United States Patent
Chung

(10) Patent No.: US 7,520,805 B2
(45) Date of Patent: Apr. 21, 2009

(54) HOUSING WITH HIDDEN VENTILATION HOLES

(75) Inventor: Ming-Tsai Chung, Taipei (TW)

(73) Assignee: D-Link Corporation, Taipei (TW)

(*) Notice: Subject to any disclaimer, the term of this patent is extended or adjusted under 35 U.S.C. 154(b) by 303 days.

(21) Appl. No.: 11/491,285

(22) Filed: Jul. 24, 2006

(65) Prior Publication Data

US 2008/0019099 A1 Jan. 24, 2008

(51) Int. Cl.
H05K 7/20 (2006.01)
H05K 7/00 (2006.01)
H05K 5/00 (2006.01)

(52) U.S. Cl. .............. 454/184; 454/275; 361/690; 361/692

(58) Field of Classification Search ............ 454/48, 454/184, 270, 356, 367, 368, 275, 370; 429/88; 361/690, 692
See application file for complete search history.

(56) References Cited

U.S. PATENT DOCUMENTS

| | | | |
|---|---|---|---|
| 2,515,950 A * | 7/1950 | Dingman | 454/184 |
| 4,098,963 A * | 7/1978 | Mocas | 429/88 |
| 4,156,794 A * | 5/1979 | Robinson | 174/16.1 |
| 4,286,028 A * | 8/1981 | Heiser et al. | 429/82 |
| 4,338,383 A * | 7/1982 | Jutte et al. | 429/88 |
| 4,659,349 A * | 4/1987 | Rodi et al. | 55/385.4 |
| 5,398,159 A * | 3/1995 | Andersson et al. | 361/695 |
| 6,027,535 A * | 2/2000 | Eberle et al. | 361/690 |
| 6,072,159 A * | 6/2000 | Wilkie et al. | 219/403 |
| 6,365,826 B1 * | 4/2002 | Stendardo et al. | 174/17 VA |
| 6,614,656 B1 * | 9/2003 | Huang | 361/690 |
| 2003/0050002 A1 * | 3/2003 | Pfister | 454/184 |

* cited by examiner

Primary Examiner—Steven B. McAllister
Assistant Examiner—Patrick F. O'Reilly, III
(74) Attorney, Agent, or Firm—Bacon & Thomas, PLLC

(57) ABSTRACT

The present invention is to provide a housing structure of an electronic device, which comprises a housing including a slot on a top surface; a plate member mounted in the slot and including a plurality of first ventilation holes formed along a periphery, the first ventilation holes being in communication with inside of the housing; and a cap mounted on the plate member and spaced from the top surface of the housing by a peripheral gap formed between the cap and the plate member; wherein the first ventilation holes are concealed by the cap. By utilizing the present invention, hot air inside the housing can be quickly removed via the first ventilation holes and the gap so as to achieve the purpose of heat dissipation, and the housing's appearance can be preserved since the first ventilation holes are concealed by the cap.

6 Claims, 2 Drawing Sheets

HOUSING WITH HIDDEN VENTILATION HOLES

FIELD OF THE INVENTION

The present invention relates to a housing of an electronic device, and more particularly to such a housing having a plurality of hidden ventilation holes for facilitating heat removal while preserving the housing's appearance.

BACKGROUND OF THE INVENTION

This world has entered into a new era with information and electronic technologies being progressed rapidly. A wide variety of computer related advanced products and mobile communications products are commercially available. Moreover, network communications technology has known a fast development in recent years. Characteristics of these high-technology products and mobile communications products are comprised of compactness, multifunction, and low price. Therefore, people love to use these kinds of 3C products and even ask more from them. In the other aspect, continuous advancements of these electronic devices are desired by people. Advanced circuitry including a main processing unit is employed by these powerful electronic devices so as to provide more useful functionalities to users. An electronic component of relatively high operation speed produces relatively greater amount of energy (i.e., higher temperature due to high heat). Thus, excessive high working temperature may adversely affect a normal functioning of an electronic device if it does not have an effective heat dissipation means. To the worse, a useful product life of the electronic device may get shortened quickly. And in turn, it may greatly decrease sales of such electronic devices in the market.

Conventionally, as a most common cost effective means for dissipating heat generated by an electronic device, a plurality of large ventilation holes are provided on the housing of an electronic device. Hot air inside the electronic device is adapted to draw to outside of the electronic device through the ventilation holes and at the same time outside cooling air is circulated through the ventilation holes to effectively lower the inside temperature of the electronic device during operation. These ventilation holes formed on the housing of an electronic device are adapted for ventilation (i.e., heat removal). However, structural strength of the housing of the electronic device may be decreased significantly due to many ventilation holes. Thus, the structurally weak housing of such electronic device is subject to deformation or damage due to collision during transportation. Further, the provision of ventilation holes on the housing of an electronic device is not aesthetic as viewed by many designers of the art in consideration of the fast development of electronic devices. Thus, electronic devices produced by manufacturers of the art are required to have an effective heat dissipation means. Also, drawbacks (e.g., reduction of structural strength and being not aesthetic) associated with the provision of ventilation holes on the housing are required to be eliminated from an electronic device. Therefore, consumers may like to and are willing to buy these electronic devices. Another drawback of the provision of ventilation holes is that the ventilation holes, in accordance with the specifications of related rules, are required to be sufficiently small. Otherwise, sparks due to malfunction of circuitry of an electronic device may spread to the outside of the electronic device through the ventilation holes and may even cause an accident. This potential danger is not desired. Thus, it is desirable among manufacturers of the art to provide an electronic device having a novel housing with hidden ventilation holes having the advantages of reduced diameter, being aesthetic, and effective heat removal in order to fulfill the user needs and be more competitive in the market.

SUMMARY OF THE INVENTION

After considerable research and experimentation, a housing of an electronic device having hidden ventilation holes according to the present invention has been devised so as to overcome the above drawbacks of the prior art housing.

It is an object of the present invention to provide a housing structure of an electronic device, comprising a housing including a slot on a top surface; a plate member mounted in the slot and including a plurality of first ventilation holes formed along a periphery, the first ventilation holes being in communication with inside of the housing; and a cap mounted on the plate member and spaced from the top surface of the housing by a peripheral gap formed between the cap and the plate member; wherein the first ventilation holes are concealed by the cap. By utilizing the present invention, hot air inside the housing can be quickly removed via the first ventilation holes and the gap so as to achieve the purpose of heat dissipation. Moreover, the housing's appearance can be preserved since the first ventilation holes are concealed by the cap.

The above and other objects, features and advantages of the present invention will become apparent from the following detailed description taken with the accompanying drawings.

DETAILED DESCRIPTION OF THE PREFERRED EMBODIMENTS

Figure 1:
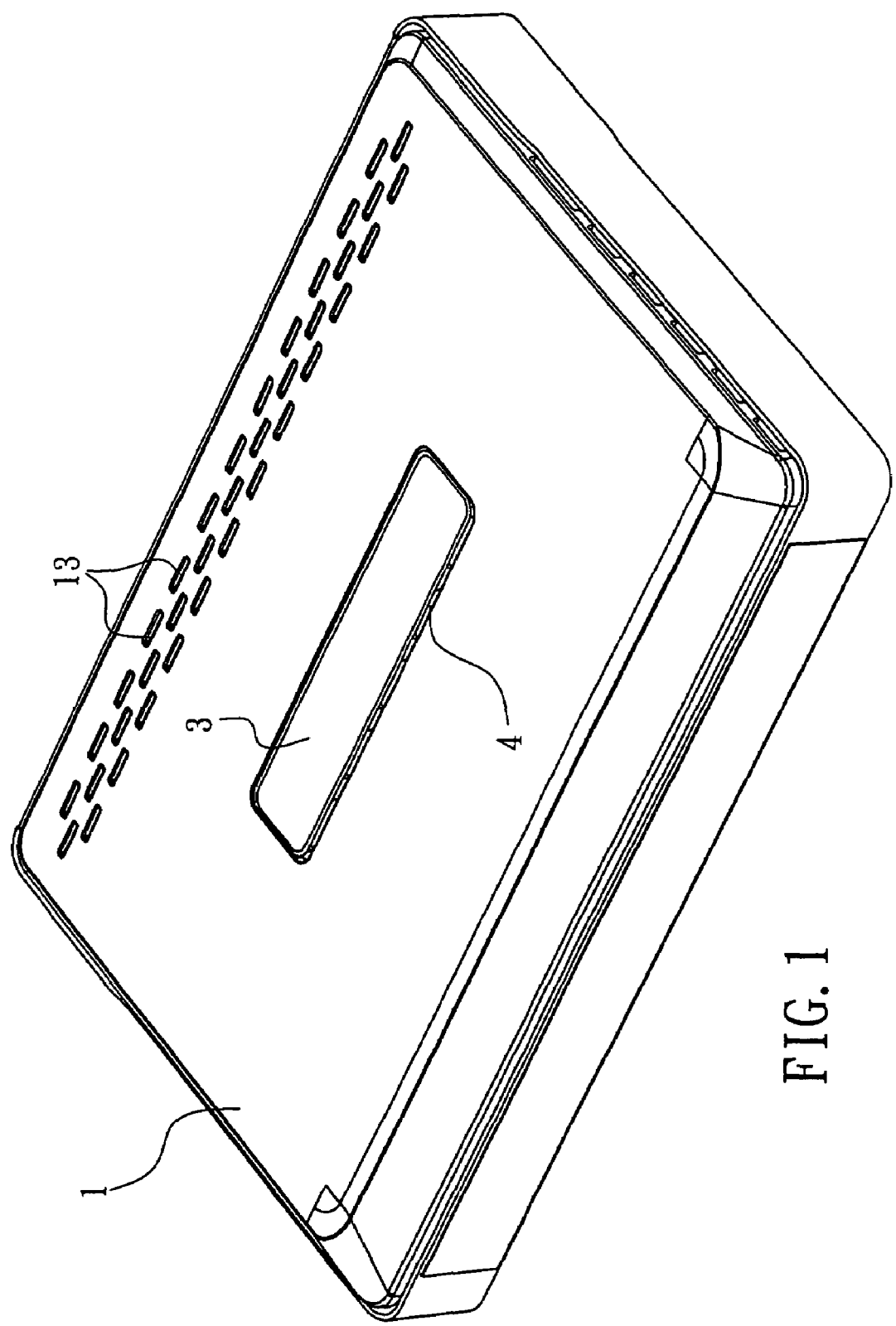
FIG. 1 is a perspective view of a preferred embodiment of a housing of an electronic device according to the invention.
Figure 2:
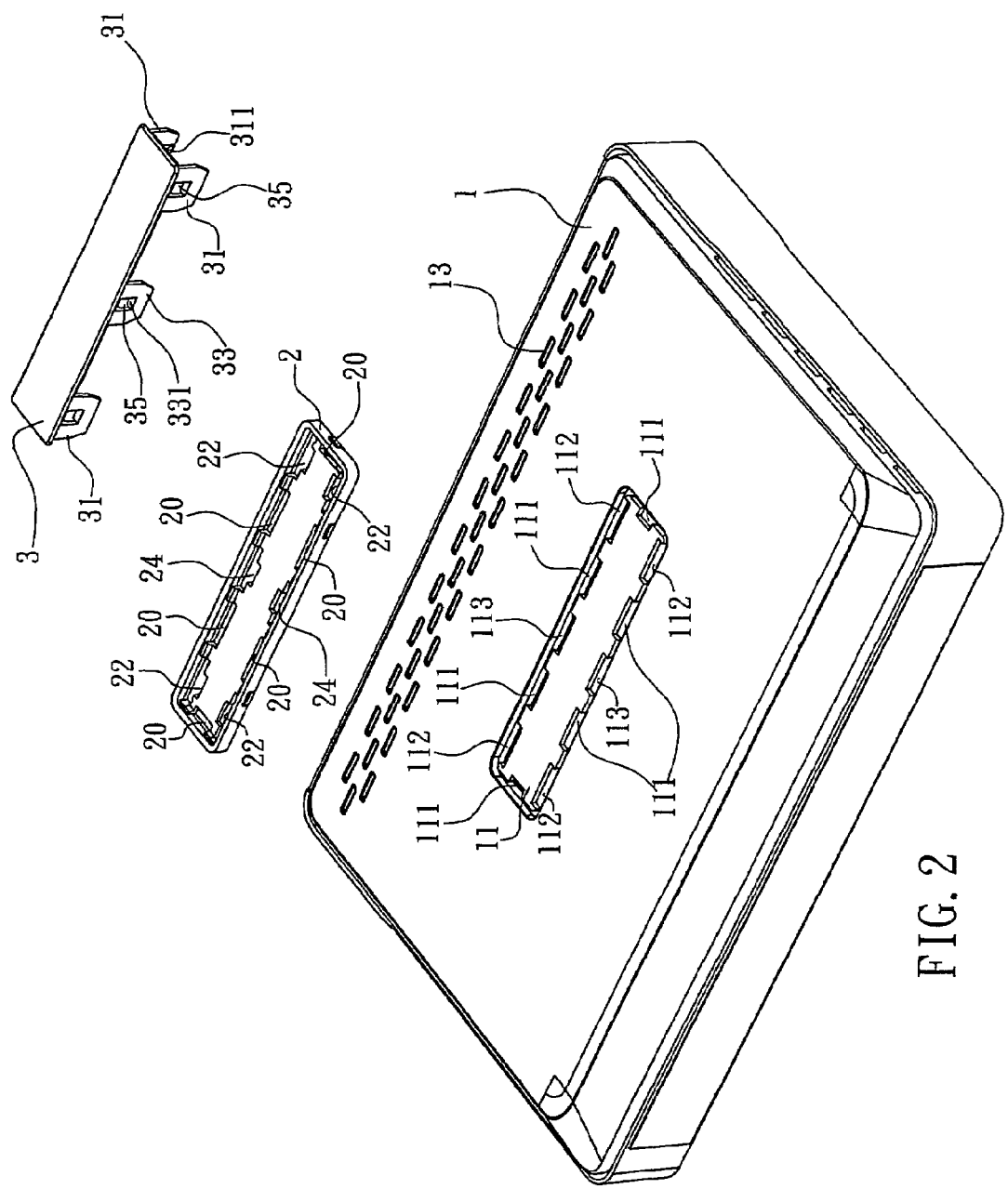
FIG. 2 is an exploded perspective of the housing.

Referring to FIGS. 1 and 2, a housing structure of an electronic device in accordance with a preferred embodiment of the invention comprises a housing 1, a plate member 2, and a cap 3 as is shown. Each component is discussed in detail below.

The parallelepiped housing 1 comprises a rectangular slot 11 on a top surface. The plate member 2 is dimensioned and shaped to fit snugly in the slot 11. The plate member 2 comprises a plurality of first ventilation holes 20 provided along a periphery. The first ventilation holes 20 are in communication with inside of the housing 1. The cap 3 is mounted on the plate member 2 which is again fitted on the housing 1. A peripheral gap 4 is formed between the cap 3 and the plate member 2. Thus, hot air inside the housing 1 can be quickly removed out of the housing 1 via the first ventilation holes 20 and the gap 4. As an end, the purpose of heat dissipation is achieved. Moreover, the first ventilation holes 20 are concealed by the cap 3, thereby preserving the housing's 1 appearance. Further, the sizes of the first ventilation holes 20 are not limited by the specifications of related safety rules since they are hidden. In short, the housing 1 has the advantages of being aesthetic, being capable of quickly removing heat, being robust, and complying with safety rules.

Referring to FIGS. 1 and 2 again, in the embodiment of the invention the slot 11 is recessed into the top surface of the housing 1. A bottom surface of the plate member 2 is engaged with a bottom surface of the slot 11 and a top surface thereof is secured to the top surface of the housing 1 respectively. Thus, the plate member 2 is fastened in the slot 11. The first ventilation holes 20 are formed on both ends and both sides of the plate member 2. The first ventilation holes 20 are in communication with a plurality of second ventilation holes 111 formed along a peripheral edge of a bottom of the slot 11. Thus, high heat inside the housing 1 can be quickly removed out of the housing 1 via the second and first ventilation holes 111, 20 and the gap 4. As an end, the purpose of heat dissipation is achieved.

Referring to FIG. 2 again, in the embodiment of the invention a plurality of downward extending first latches 31 are formed on four corners of the rectangular cap 3. The first latches 31 are extended into the slot 11 through a plurality of first holes 22 on both sides of the plate member 2. On both sides of the bottom of the slot 11 there are further provided a plurality of first cavities 112 which correspond to the first holes 22. A plurality of first hooks 311 each extended inward from an end of the first latch 31 is adapted to insert into the corresponding first cavity 112. As an end, both the cap 3 and the plate member 2 are fastened in the slot 11.

Referring to FIG. 2 again, in the embodiment of the invention a downward extending second latch 33 is formed on either side of the cap 3 and is disposed between the two first latches 31 of the same side. Each of the second latches 33 is extended into the slot 11 through a second hole 24 formed at a center of either side of the plate member 2. The second hole 24 is disposed between the two first ventilation holes 20 of the same side. On a center of either sides of the bottom of the slot 11 there is further provided a second cavity 113 which is disposed between the two first cavities 112 and corresponds to the second hole 24. A second hook 331 extended inward from an end of either second latch 33 is adapted to insert into the corresponding second cavity 113. As an end, the structural strength of the plate member 2 and the cap 3 assembled in the slot 11 is greatly increased.

Referring to FIG. 2 again, in the embodiment of the invention an opening 35 is formed between a top joining portion and an open end of each of the first and second latches 31, 33. Thus, hot air inside the housing 1 can be removed out of the housing 1 via the sides of the second cavities 113 opposite the second latches 33, the openings 35, and the gap 4. Further, a plurality of third ventilation holes 13 are formed on the top surface of the housing 1 along one side. The third ventilation holes 13 are disposed in three rows in which the third ventilation holes 13 of any row are disposed alternately with that of the adjacent row. The provision of the third ventilation holes 13 can facilitate heat removal out of the housing 1. As an end, the total heat dissipation performance of the housing 1 is increased significantly.

In view of the above, the housing with hidden ventilation holes according to the invention has the following advantages:

(i) High heat can be quickly removed out of the housing 1 via the first, second, and third ventilation holes 20, 111, and 13, the openings 35, the second cavities 113, and the gap 4 by utilizing the housing structure.

(ii) Both the plate member 2 and the cap 3 are fastened in the slot 11. Thus, electronic components in the housing 1 are prevented from being damaged due to collision.

(iii) The ventilation holes 111 and 20 are concealed by the cap 3 when the cap 3 is mounted on the plate member 2. Thus, it is possible to quickly remove heat while preserving the housing's 1 appearance.

(iv) The sizes of the first ventilation holes 20 are not limited by the specifications of related safety rules since the ventilation holes 111 and 20 are hidden by the cap 3. Moreover, operating safety of the electronic device is greatly increased because its housing has hidden ventilation holes.

While the invention herein disclosed has been described by means of specific embodiments, numerous modifications and variations could be made thereto by those skilled in the art without departing from the scope and spirit of the invention set forth in the claims.

What is claimed is:

1. A housing structure of an electronic device, comprising:
   a housing including a slot on a top surface thereof, wherein the slot is recessed into the top surface of the housing, and comprises a plurality of second ventilation holes formed along a peripheral edge of a bottom surface of the slot in communication with inside of the housing;
   a plate member mounted in the slot and including a plurality of first ventilation holes and a plurality of first holes formed along a periphery thereof respectively, wherein the first ventilation holes are in communication with the second ventilation holes, a bottom surface of the plate member is engaged with the bottom surface of the slot, and a top surface of the plate member is secured to the top surface of the housing; and
   a cap mounted on the plate member, spaced from the top surface of the housing by a peripheral gap formed between the cap and the plate member and comprising a plurality of downward extending first latches formed along a periphery thereof, wherein the first latches are extended into the first holes and into the slot for fastening the cap to the slot and concealing the first ventilation holes by the cap.

2. The housing structure of claim 1, wherein the slot further comprises a plurality of first cavities formed along a periphery of the bottom surface, the first cavities correspond to the first holes, and wherein each of the first latches comprises a first hook extended inward from an end, the first hook being adapted to insert into the first cavity.

3. The housing structure of claim 2, wherein the plate member further comprises a second hole formed along the periphery thereof, the second hole being disposed between the first ventilation holes, and wherein the cap further comprises a downward extending second latch formed along the periphery thereof, the second latch being disposed between the first latches and being extended into the slot for fastening through the second hole.

4. The housing structure of claim 3, wherein the slot further comprises a second cavity formed along the periphery of the bottom surface, the second cavity being disposed between the first cavities and corresponded to the second hole, and wherein the second latch comprises a second hook extended inward from an end, the second hook being adapted to insert into the second cavity for fastening.

5. The housing structure of claim 4, wherein each of the first and second latches comprises an opening formed between a top joining portion and an open end.

6. The housing structure of claim 5, wherein the housing further comprises a plurality of third ventilation holes formed on the top surface along one side, the third ventilation holes being disposed in a plurality of rows with the third ventilation holes of any one of the rows being disposed alternately with that of the adjacent row.

* * * * *